United States Patent
Fouda

(10) Patent No.: US 12,159,683 B2
(45) Date of Patent: Dec. 3, 2024

(54) METHODS FOR EFFICIENT 3D SRAM-BASED COMPUTE-IN-MEMORY

(71) Applicant: Rain Neuromorphics Inc., San Francisco, CA (US)

(72) Inventor: Mohammed Elneanaei Abdelmoneem Fouda, Irvine, CA (US)

(73) Assignee: Rain Neuromorphics Inc., San Francisco, CA (US)

( * ) Notice: Subject to any disclaimer, the term of this patent is extended or adjusted under 35 U.S.C. 154(b) by 0 days.

(21) Appl. No.: 18/653,788

(22) Filed: May 2, 2024

(65) Prior Publication Data

US 2024/0371415 A1    Nov. 7, 2024

Related U.S. Application Data

(60) Provisional application No. 63/463,847, filed on May 3, 2023.

(51) Int. Cl.
| | |
|---|---|
| *G11C 7/10* | (2006.01) |
| *G06F 17/16* | (2006.01) |
| *G11C 11/54* | (2006.01) |
| *H10B 10/00* | (2023.01) |

(52) U.S. Cl.
CPC ............ *G11C 7/1006* (2013.01); *G06F 17/16* (2013.01); *G11C 11/54* (2013.01); *H10B 10/00* (2023.02)

(58) Field of Classification Search
CPC ....... G11C 7/1006; G11C 11/54; H10B 10/00; G06F 17/16
USPC ..................................... 365/230.03
See application file for complete search history.

(56) References Cited

U.S. PATENT DOCUMENTS

| | | |
|---|---|---|
| 2015/0199266 A1 | 7/2015 | Franchetti |
| 2016/0117109 A1 | 4/2016 | Patel |
| 2021/0125040 A1 | 4/2021 | Cassidy |
| 2021/0150328 A1 | 5/2021 | Dasalukunte |
| 2023/0010537 A1 | 1/2023 | Ming-Yan |

(Continued)

OTHER PUBLICATIONS

Peng et al., Heterogeneous 3-D Integration of Multitier Compute-in-Memory Accelerators: An Electrical-Thermal Co-Design, IEEE Transactions on Electron Devices, vol. 68, No. 11, Nov. 2021, pp. 5598-5605.

(Continued)

*Primary Examiner* — Connie C Yoha
(74) *Attorney, Agent, or Firm* — Van Pelt, Yi & James LLP

(57) ABSTRACT

A computing device is described. The computing device includes first and second arrays of compute units and first and second arrays of routers. The first array of compute units is arranged on a first substrate and includes a first plurality of compute-in-memory (CIM) modules. The first array of routers is configured to route information horizontally among the first array of compute units. The second array of compute units is arranged on a second substrate and includes a second plurality of CIM modules. The second substrate is disposed vertically from the first substrate. The second array of routers is configured to route the information horizontally among the second array of compute units on the second substrate. The first array of routers and the second array of routers send the information vertically between the first substrate and the second substrate.

20 Claims, 9 Drawing Sheets

(56) References Cited

U.S. PATENT DOCUMENTS

2024/0143541 A1* 5/2024 Fouda ............... G06F 15/80
2024/0160693 A1* 5/2024 Fouda ............... G06F 17/16

OTHER PUBLICATIONS

Shiba et al., A 12.8-GB/s 0.5-pJ/b Encoding-Less Inductive Coupling Interface Achieving 111-GB/s/W 3D-Stacked SRAM in 7-nm FinFET, IEEE Solid-State Circuits Letters, vol. 6, 2023, pp. 65-68.

Shiba et al., A 3D-Stacked SRAM Using Inductive Coupling with Low-Voltage Transmitter and 12:1 SerDes, 2020 IEEE.

Shiba et al., A 96-MB 3D-Stacked SRAM Using Inductive Coupling With 0.4-V Transmitter, Termination Scheme and 12:1 SerDes in 40-nm CMOS, IEEE Transactions on Circuits and Systems—I: Regular Papers, vol. 68, No. 2, Feb. 2021, pp. 692-703.

Shiba et al., Crosstalk Analysis and Countermeasures of High-Density Multi-Hop Inductive Coupling Interface for 3D-Stacked Memory, 2020 IEEE Electrical Design of Advanced Packaging and Systems (EDAPS), 2020 IEEE.

* cited by examiner

METHODS FOR EFFICIENT 3D SRAM-BASED COMPUTE-IN-MEMORY

CROSS REFERENCE TO OTHER APPLICATIONS

This application claims priority to U.S. Provisional Patent Application No. 63/463,847 entitled METHODS FOR EFFICIENT 3D SRAM-BASED COMPUTE-IN-MEMORY filed May 3, 2023 which is incorporated herein by reference for all purposes.

BACKGROUND OF THE INVENTION

Artificial intelligence (AI), or machine learning, utilizes learning networks (e.g. deep neural networks) loosely inspired by the brain in order to solve problems. Learning networks typically include layers of weights that weight signals (mimicking synapses) interleaved with activation layers that apply activation functions to the signals (mimicking neurons). Thus, a weight layer provides weighted input signals to an activation layer. Neurons in the activation layer operate on the weighted input signals by applying some activation function to the input signals and provide output signals corresponding to the statuses of the neurons. The output signals from the activation layer are provided as input signals to the next weight layer, if any. This process may be repeated for the layers of the network. Learning networks are thus able to reduce complex problems to a set of weights and the applied activation functions. The structure of the network (e.g., number of layers, connectivity among the layers, dimensionality of the layers, the type of activation function, the weights or parameters for the network, etc.) are together known as a model. The values of the parameters (e.g. the weights used for particular tasks) for the model are identified via training of the learning network. Moreover, learning networks can leverage hardware, such as graphics processing units (GPUs) and/or AI accelerators, which perform operations usable in machine learning in parallel. Such tools can dramatically improve the speed and efficiency with which data-heavy and other tasks can be accomplished by the learning network.

Although a trained learning network is capable of solving challenging problems, models continue to rapidly increase in size. The number of parameters to be stored in an AI accelerator thus grows significantly. The large number of parameters to be stored may require integrated circuits (ICs) forming the AI accelerator to occupy a larger area. IC fabrication costs increase quadratically with the IC size. As a result, AI accelerators may become prohibitively expensive. Scaling the IC out of plane (e.g. 2.5D scaling or multilayer stacking) offers higher memory density. This scaling may allow for higher compute power, less data movement, as well as energy and latency savings. However, current technologies have drawbacks such as requiring precise alignment, increased expense, low manufacturing yield, and low bandwidth. Alternative approaches such as chiplet integration could slow performance of the AI accelerator. Accordingly, techniques for handling the ever increasing size of models in AI accelerators are still desired.

BRIEF DESCRIPTION OF THE DRAWINGS

Various embodiments of the invention are disclosed in the following detailed description and the accompanying drawings.

DETAILED DESCRIPTION

Figure 1A:
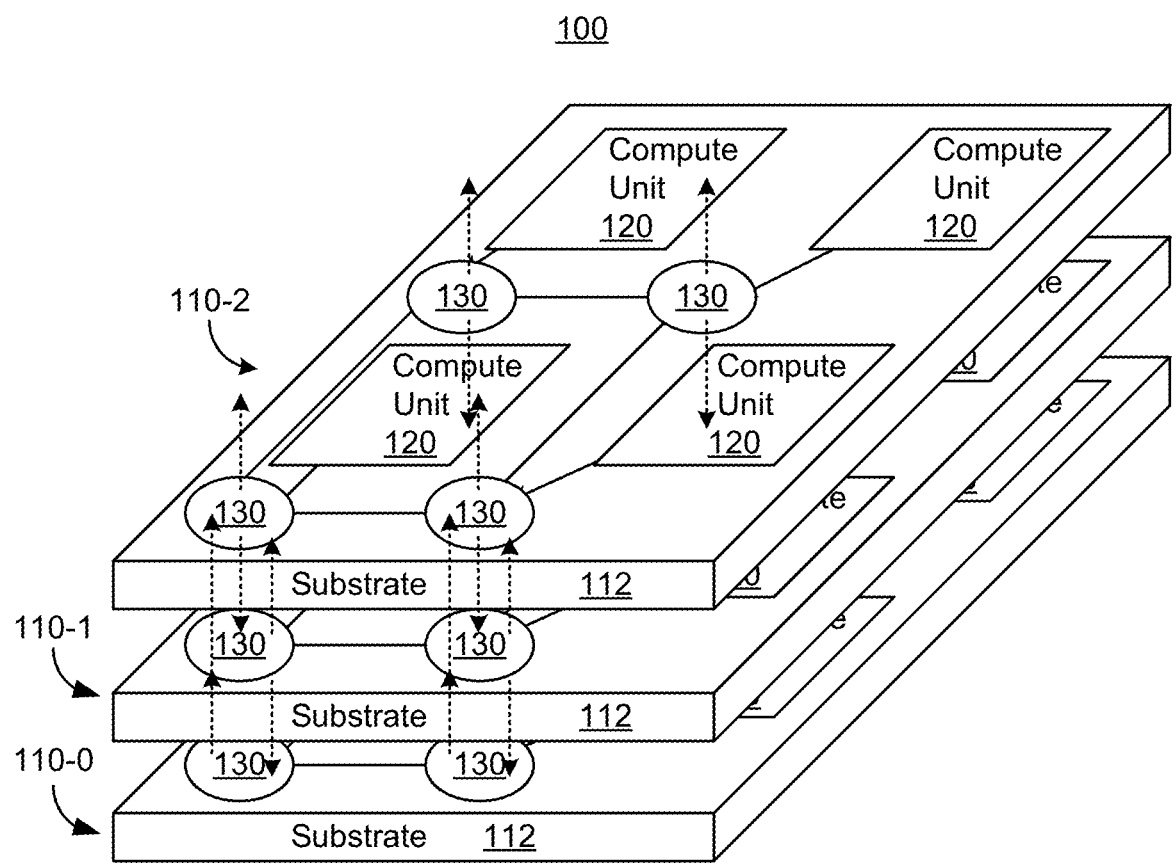
FIGS. 1A-1B depict an embodiment of a computing device usable in a learning network.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A computing device is described. The computing device includes a first array of compute units, a first array of routers, a second array of compute units, and a second array of routers. The first array of compute units is arranged on a first substrate and includes a first plurality of compute-in-memory (CIM) modules. The first array of routers is configured to route information horizontally among the first array of compute units on the first substrate. The second array of compute units is arranged on a second substrate and includes a second plurality of CIM modules. The second substrate is disposed vertically from the first substrate. The second array of routers is configured to route the information horizontally among the second array of compute units. The first array of routers and the second array of routers are configured to send the information vertically between the first substrate and the second substrate.

In some embodiments, each router of the first array of routers includes an in-plane portion and an out-ot-plane portion. The in-plane portion has horizontal routing connections coupled with a portion of the first plurality of CIM modules. For example, the in-plane portion may include a switch. The out-of-plane portion may include at least one inductive coupling interface. The out-of-plane portion may further include a serializer/deserializer and/or a modulator/demodulator for sending and receiving the information. The out-of-plane portion may be coupled between a compute unit of the first array of compute units and the in-plane portion. In some embodiments, the horizontal routing connections include not more than five horizontal routing connections. Some or all of the first array of routers may include the in-plane portion and the out-of-plane portion. In some embodiments, each router of both the first array of routers and the second array of routers includes the in-plane portion and the out-of-plane portion.

A CIM module of the first plurality of CIM modules may include storage cells storing data corresponding to a matrix and logic for performing a vector-matrix multiplication (VMM) of the matrix. The storage cells may include SRAM cells. Each of the first array of compute units may include a tile having a general purpose processor and a portion of the CIM modules. The CIM modules may include the storage cells that store a matric and logic for performing the VMM.

The compute device may include a third array of compute units and a third array of routers. The third array of compute units are arranged on a third substrate. The third substrate is disposed vertically from the first and second substrates. The third array of routers are configured to route the information horizontally among the third array of compute units. The first array of routers, the second array of routers, and the third array of routers send information vertically between the first substrate, the second substrate, and the third substrate.

A method is described. The method includes transmitting information from a first compute unit of a first array of compute units to a first router of a first array of routers. The first array of compute units and the first array of routers are arranged on a first substrate. The first array of compute units includes a first plurality of compute-in-memory (CIM) modules. The method also includes wirelessly sending the information from the first router to a second router of a second array of routers. The second array of routers and a second array of compute units are arranged on a second substrate. The second array of compute units includes a second plurality of CIM modules. The second substrate is disposed vertically from the first substrate. Wherein the first array of routers horizontally between the first array of compute units and the second array of routers are configured to send data horizontally between the second array of compute units.

In some embodiments, the method includes sending the information from the second router to a second compute unit in the second array of compute units. The method may also include serializing, by the first router, the information from the first compute unit to provide serialized information. The method may also include modulating, by the first router, the serialized information to provide modulated, serialized information. In such embodiments, wirelessly sending the information includes wirelessly sending the modulated, serialized information by the first router, which is inductively coupled with the second router. The method may also include demodulating, by the second router, the modulated, serialized information to provide the serialized information at the second router. The method also includes deserializing, by the second router, the serialized information.

Figure 1B:
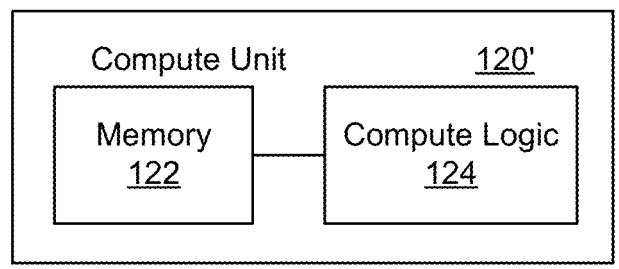

FIGS. 1A-1B depict an embodiment of computing device 100 usable in a learning network, such as a hardware artificial intelligence (AI) accelerator. In some embodiments, system 100 may be considered to be the hardware AI accelerator. Computing device 100 includes three layers 110-0, 110-1, and 110-2 (collectively or generically layer(s) 110). In the embodiment shown, layers 110 are essentially the same. However, layer 110-0 (e.g. the bottom layer) may have several processing and other blocks and may be responsible for the communication to devices (not shown) outside of computing device 100. For example, layer 110-0 may have UCIe and/or DMA controllers in addition to some peripheral circuits. In some embodiments, layers 110 may differ in other ways. For example, layers 110 may have a different number and/or type of compute units 120 and/or routers 130. Although three layers 110 are shown, another number of layers (e.g. 2, 4, 5, or more) may be present. Computing device 100 may be implemented as a single, vertically scaled integrated circuit (IC).

Each layer 110 includes compute units 110 and routers 130 residing on substrate 112. Although four compute units 120 and four routers 130 are shown, another number of either or both may be present. In computing device 100, the number of routers 130 is the same as the number of compute units 120. In some embodiments, the number of routers 130 may differ from the number of compute units 120. Compute units 120 and routers 130 are arranged in rectangular arrays in each layer 110. In some embodiments, compute units and routers 130 may be arranged in another manner.

Each compute unit 120 includes compute in-memory (CIM) modules. CIM modules may also be termed in-memory compute (IMC) modules. For example, FIG. 1B depicts an embodiment of compute unit 120'. Compute unit 120' includes memory 122 and compute logic 124. For example, memory 122 may include static random access memory (SRAM) storage cells that store weights for a matrix. Other nonvolatile technologies such as resistive RAM, phase change memories, and/or other memories may be used in lieu of or in addition to SRAM. Compute logic 124 is coupled with memory 122 such that a vector-matrix multiplication (VMM) may be performed in parallel by compute unit 120. Each compute unit 120 may perform VMMs in parallel. Other and/or additional components may be present. For example, a general purpose processor (e.g. a reduced instruction set computer such as a RISC-V or ARM processor), single instruction multiple data (SIMD) unit(s), additional memory (e.g. an SRAM scratchpad memory), mesh networking modules, and/or direct memory access (DMA) modules may be present in each compute unit 120. In some embodiments, each compute unit 120 is a tile such that each layer 110 may be a system-on-a-chip (SoC).

Routers 130 interconnect compute units 120 in a layer 110. In computing device 100, routers 130 allow each compute unit 120 to communicate with all other compute units 120 in the same layer 110. Thus, routers 130 provide for horizontal routing of data between compute units 120. The connections between routers 130 and between particular routers 130 and the corresponding compute unit 120 are explicitly shown in computing device 100. For the horizontal routing of data in a layer 110, router 130 may be configured as a switch. In other embodiments, routers 130 only allow for communication between a particular compute unit 120 and a portion of the remaining compute units 120.

In addition to horizontal routing, at least some routers 130 provide for vertical communication between layers 110. In computing device 100, all routers 130 perform both horizontal routing (i.e. transfer of information between compute units 120 in the same layer 110) and vertical routing (i.e. transfer of information between layers 110). In other embodiments, only a portion of routers 130 perform vertical communication. In such embodiments, information to be transmitted vertically may first be transferred horizontally in a layer 110 to the particular router(s) 130 that are capable of transmitting information vertically, and then transmitted by the particular router(s) 130 to another layer 110. The communication between layers 110 by routers 130 is indicated by dashed arrows in FIG. 1A.

Routers 130 in one layer 110 are inductively coupled to routers in another layer 110. Thus, routers 130 transfer information wirelessly between layers using inductive coupling. Stated differently, routers 130 in one layer 110 may broadcast data to other layer(s) 110. In some embodiments, information is transferred between adjacent layers 110. For example, router(s) 130 in layer 110-2 may send information to router(s) 130 in layer 110-1 and vice versa. In some embodiments, information may also be transferred between non-adjacent layers. For example, router(s) 130 in layer 110-0 may transmit information to router(s) 130 in layer 110-2, and vice versa. In some embodiments, information may be transferred to a layer (not shown) that is two layers or more away from the layer of the source router. Transmission between non-adjacent layers 110 may be possible because the transfer of information is performed wirelessly and, in some embodiments, through the inductive coupling between routers 130. Thus, three-dimensional mesh routing may be used such that each layer 110 can communicate vertically with any other layer. In some embodiments, different frequencies of transmission/reception or other modulation may be used for particular layers.

In operation, learning network models may be mapped to computing device 100. In some embodiments, a particular layer of the learning network (e.g. a layer of weights) may be mapped to a particular layer 110 of computing device 100. Compute units 120 perform the VMMs (e.g. in parallel) to improve performance of the learning network. Activations (e.g. the resultant of a multiplication between the matrix of weights stored in compute units 120 and the input vector(s)) may be wirelessly transferred between layers 110 using routers 130. For other models, multiple layers of weights of the learning network model may be mapped to a particular layer 110 of computing device 100. Activations for learning network layers mapped to a particular layer 110 may be transferred horizontally via routers 130. Once the operations for learning network layers in the particular layer 110 have been completed, the resulting activations may be broadcast to other layers 110 by routers 130. Thus, the desired activations are communicated between layer 110. The operating frequency for the wireless transmission between routers 130 may be determined based on the technology node and compute unit 120 size and separation between routers 130 in different layers 110, the number of layers 119 to be supported, and the signal quality.

Computing device 100 may have improved performance. Compute units 120 may store weights (e.g. stationary weights) and perform VMMs in parallel. The resulting activation(s) for compute units 120 in another layer 110 are transferred vertically by routers 130. This may increase locality and reduce the data movement for computing device 100. As a result, latency and energy used (power consumed) may be reduced. Further, because wireless transmission (via inductive coupling between routers 130) may be used, this transmission of information between layers 110 may have a high bandwidth. Consequently, latency may be further improved. Because computing device 100 is integrated vertically, the area consumed by computing de vice 100 may be reduced. Computing device 100 may, therefore, have superior performance and scalability. Further, although discussed in the context of benefits for AI accelerators, computing device 100 may have improved performance when used for other applications.

Figure 2:
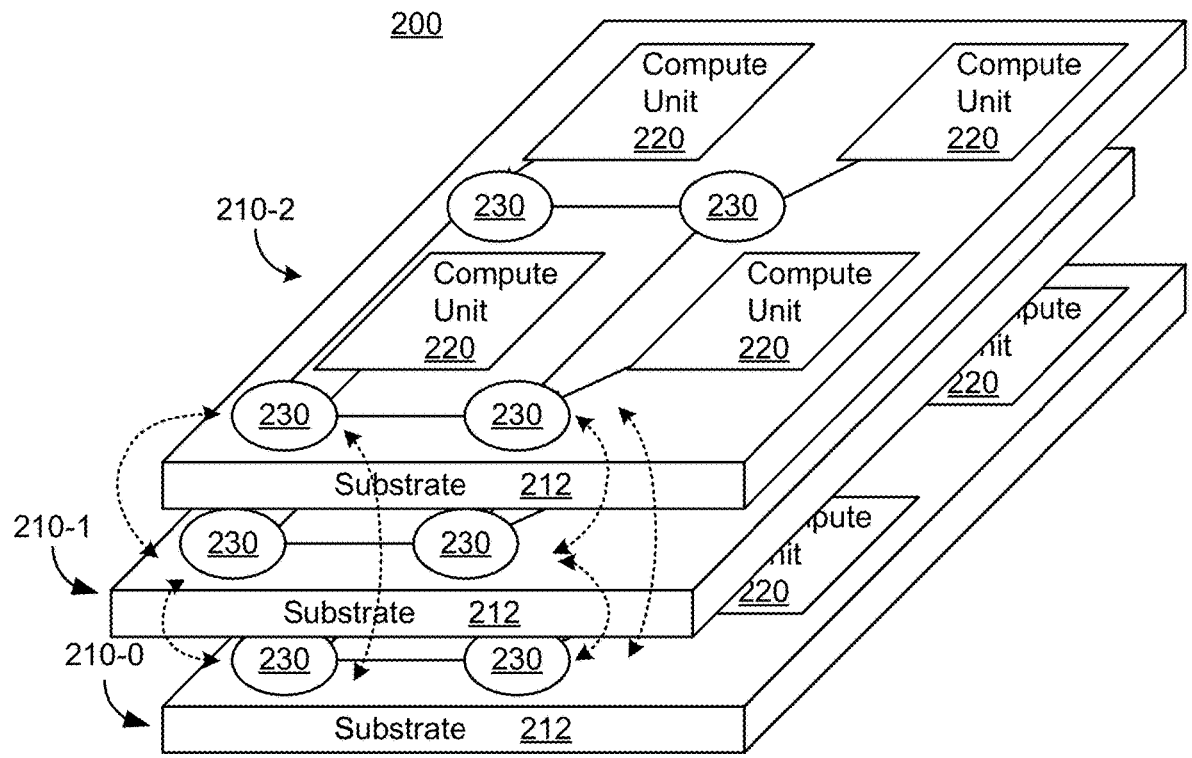
FIG. 2 depicts an embodiment of a computing device usable in a learning network.

FIG. 2 depicts depict an embodiment of computing device 200 usable in a learning network, such as a hardware AI accelerator. Computing device 200 is analogous to computing device 100. Computing device 200 includes three layers 210-0, 210-1, and 210-2 (collectively or generically layer(s) 210) that are analogous to layer(s) 110. Each layer 210 includes compute units 220 and routers 230 on substrate 212 that are analogous to compute units 120 and routers 130 on substrate 112, respectively. In the embodiment shown, layers 210 are essentially the same. However, layer 210-0 (an edge layer, such as the bottom layer) may have several processing and other blocks and is responsible for the communication external to computing device 200. In some embodiments, layers 210 may differ. For example, layers 210 may have a different number and/or type of compute units 220 and/or routers 230. Although three layers 210, four compute units 220 in each layer 210, and four routers 230 in each layer 210 are shown, another number of layers (e.g. 2, 4, 5, or more), another number of compute units 220 per layer 210, and/or another number of routers 230 per layer 210 may be present. Computing device 200 may be implemented as a single, vertically scaled IC. Further, communication between layers via routers 230 is shown by dashed two-headed arrows for routers 230 near the edges of substrates 212. In some embodiments, other routers 230 in layers 210 may also communicate vertically. However, for clarity, dashed two-headed arrows are not shown for these other routers 230.

As indicated in FIG. 2, layer 210-1 is somewhat misaligned from layers 210-0 and 210-2. However, wireless transmission of information between layer 210-1 and layers 210-0 and 210-2 is still possible. This is because the inductive coupling between routers 230 has a wider range than, for example, wired coupling using through silicon vias (TSVs) or other similar technology. Thus, fabrication of computing device 200 may be facilitated.

Computing device 200 may operate in an analogous manner to and shares the benefits of computing device 100. For example, learning network models may be mapped to layers 210. Compute units 220 may store weights and perform VMMs in parallel. Activations may be transferred wirelessly between layers using routers 230. As a result, latency and power consumed may be reduced for computing device 200. Moreover, wireless transmission of information between layers 210 may have a high bandwidth. Consequently, latency may be further improved. Because computing device 200 is integrated vertically, the area consumed by computing device 200 may be reduced. Computing device 200 may, therefore, have superior performance and scalability. Fabrication of computing device 200 may also be facilitated because alignment tolerances may be increased. Although discussed in the context of benefits for AI accelerators, computing device 200 may have improved performance when used for other applications.

Figure 3:
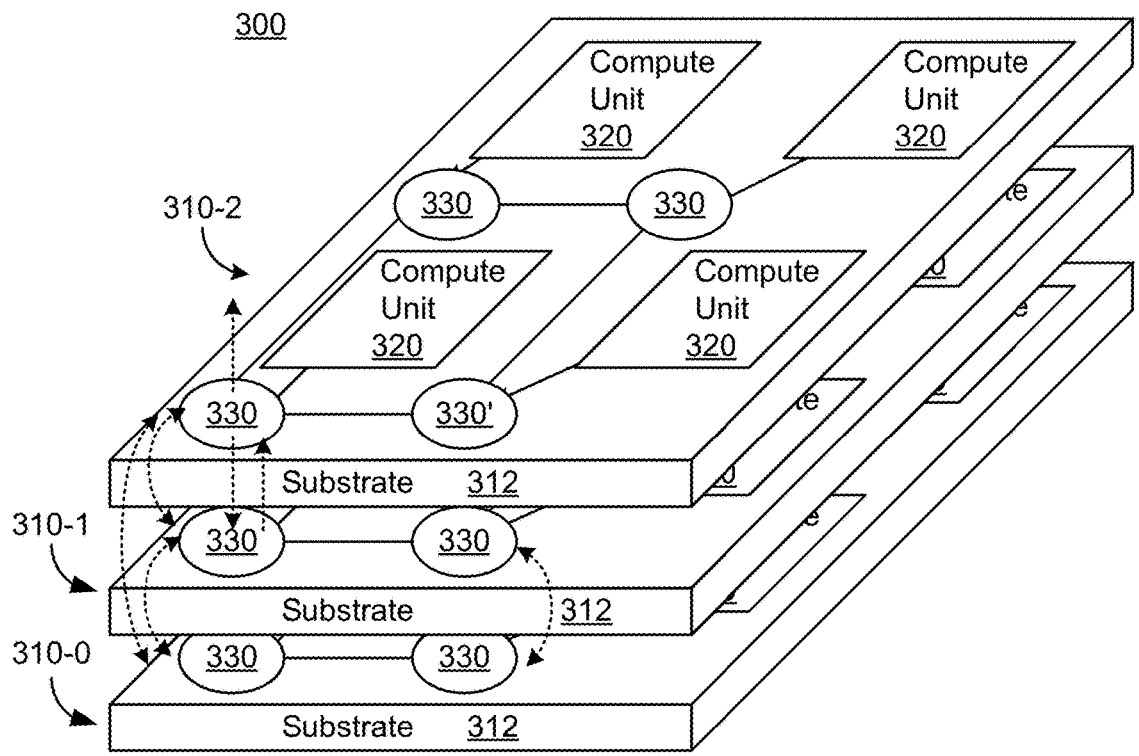
FIG. 3 depicts an embodiment of a computing device usable in a learning network.

FIG. 3 depicts depict an embodiment of computing device 300 usable in a learning network, such as a hardware AI accelerator. Computing device 300 is analogous to computing device(s) 100 and/or 200. Computing device 300 includes three layers 310-0, 310-1, and 310-2 (collectively or generically layer(s) 310) that are analogous to layer(s) 110. Each layer 310 includes compute units 320 and routers 330 on substrate 312 that are analogous to compute units 120 and routers 130 on substrate 112, respectively. In the embodiment shown, layers 310 are essentially the same. However, layer 310-0 (an edge layer, such as the bottom layer) may have several processing and other blocks and is responsible for the communication external to computing device 300. In some embodiments, layers 310 may differ. For example, layers 310 may have a different number and/or type of compute units 320 and/or routers 330. Although three layers 310, four compute units 320 in each layer 310, and four routers 330 in each layer 310 are shown, another number of layers (e.g. 3, 4, 5, or more), another number of compute units 320 per layer 310, and/or another number of routers 330 per layer 310 may be present. Computing device 300 may be implemented as a single, vertically scaled IC. Further, communication between layers via routers 330 is shown by dashed two-headed arrows for routers 330 near the edges of substrates 312. In some embodiments, other routers 330 in layers 310 may also communicate vertically. However, for clarity, dashed two-headed arrows are not shown for these other routers 330.

In computing device 300, layer 310-2 explicitly includes router 330' that does not transmit or receive data from other layers 310-1 or 310-0. Thus, in some embodiments, not all routers 330' perform wireless transmission or reception of data.

Computing device 300 may operate in an analogous manner to and shares the benefits of computing device 100. For example, learning network models may be mapped to layers 310. Compute units 320 may store weights and perform VMMs in parallel. Activations may be transferred wirelessly between layers using routers 330. As a result, latency and power consumed may be reduced for computing device 300. Moreover, wireless transmission of information between layers 310 may have a high bandwidth. Consequently, latency may be further improved. Because computing device 300 is integrated vertically, the area consumed by computing device 300 may be reduced. Computing device 300 may, therefore, have superior performance and scalability. Fabrication of computing device 300 may also be facilitated because alignment tolerances may be increased. Although discussed in the context of benefits for AI accelerators, computing device 300 may have improved performance when used for other applications.

Figure 4:
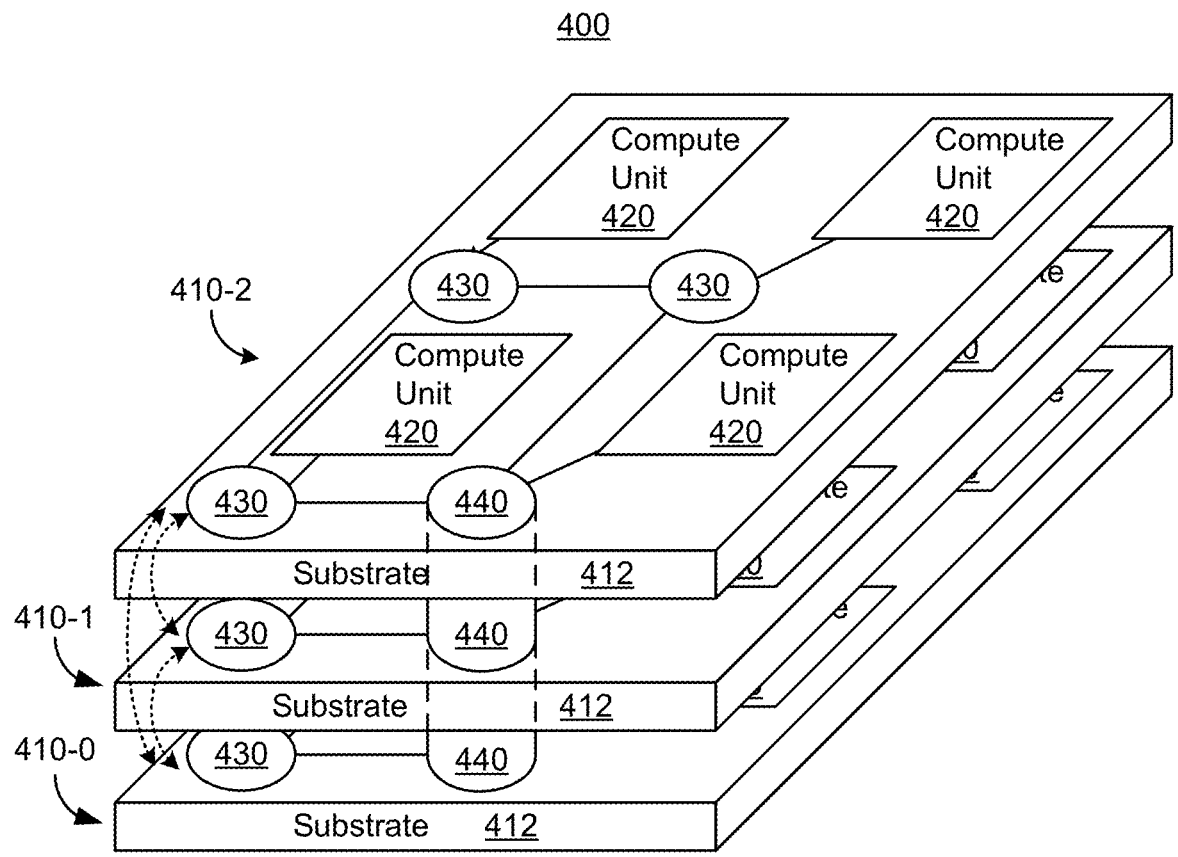
FIG. 4 depicts an embodiment of a computing device usable in a learning network.

FIG. 4 depicts depict an embodiment of computing device 400 usable in a learning network, such as a hardware AI accelerator. Computing device 400 is analogous to computing device 100. Computing device 400 includes three layers 410-0, 410-1, and 410-2 (collectively or generically layer(s) 410) that are analogous to layer(s) 110. Each layer 410 includes compute units 420 and routers 430 on substrate 412 that are analogous to compute units 120 and routers 130 on substrate 112, respectively. In the embodiment shown, layers 410 are essentially the same. However, layer 410-0 (an edge layer, such as the bottom layer) may have several processing and other blocks and is responsible for the communication external to computing device 400. In some embodiments, layers 410 may differ. For example, layers 410 may have a different number and/or type of compute units 420 and/or routers 430. Although three layers 410, four compute units 420 in each layer 410, and four routers 430 in each layer 410 are shown, another number of layers (e.g. 4, 4, 5, or more), another number of compute units 420 per layer 410, and/or another number of routers 430 per layer 410 may be present. Computing device 400 may be implemented as a single, vertically scaled IC. Further, communication between layers via routers 430 is shown by dashed two-headed arrows for routers 430 near the edges of substrates 412. In some embodiments, other routers 430 in layers 410 may also communicate vertically. However, for clarity, dashed two-headed arrows are not shown for these other routers 430.

In computing device 400, layers 410-2 explicitly includes TSVs 440 that transfer data between layers via wired communication. Thus, in some embodiments, transmission of data between layers 410 may take place both via wireless and wired communication.

Computing device 400 may operate in an analogous manner to and shares the benefits of computing device 100. For example, learning network models may be mapped to layers 410. Compute units 420 may store weights and perform VMMs in parallel. Activations may be transferred wirelessly between layers using routers 430. As a result, latency and power consumed may be reduced for computing device 400. Moreover, wireless transmission of information between layers 410 may have a high bandwidth. Consequently, latency may be further improved. However, this may be mitigated by the use of TSVs 440. Because computing device 400 is integrated vertically, the area consumed by computing device 400 may be reduced. Computing device 400 may, therefore, have superior performance and scalability. Although discussed in the context of benefits for AI accelerators, computing device 400 may have improved performance when used for other applications.

Figure 5:
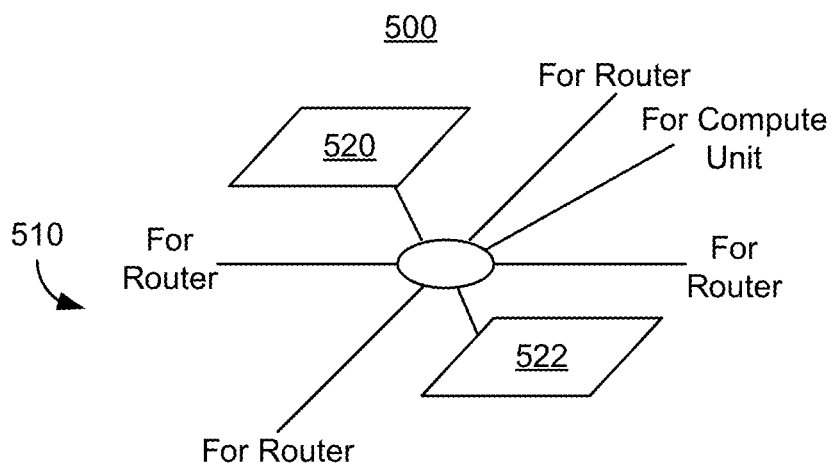
FIG. 5 depicts an embodiment of a router usable in a learning network.

FIG. 5 depicts an embodiment of router 500 usable in a learning network. For example, router 500 may be used as router 130, 230, 330, and/or 430 in computing devices 100, 200, 300, and/or 400, respectively. Router 500 includes an in-plane portion 510 and an out-of-plane portions 520 and 522. In-plane portion 510 includes connections to other routers and a compute unit. In-plane portion 510 also includes connections to out-of-plane portions 520 and 522. Thus, in-plane portion 510 of router 500 includes seven physical connections. This is in contrast to a router (not shown) that is in-plane only, which includes five connections (to four other routers and to a compute unit). Out-of-plane portions 520 and 522 each has a single physical connection to in-plane portion 510. Out-of-plane portions 520 and 522 can also be wirelessly coupled to other layers. In some embodiments, out-of-plane portions 520 sends information to and receives information from router(s) (not shown) in layer(s) above, while out-of-plane portion 522 sends information to and receives information from router(s) (not shown) in layer(s) below. In some embodiments, out-of-plane portion 520 sends information to other layer(s) above and below, while out-of-plane portion 522 receives information from other layer(s), or vice versa.

Router 500 may be used in computing devices 100, 200, 300, and/or 400. Thus, the benefits of computing devices 100, 200, 300, and/or 400 may be achieved. However, router 500 is more complex than a horizontal router because of the additional number of connections.

Figure 6:
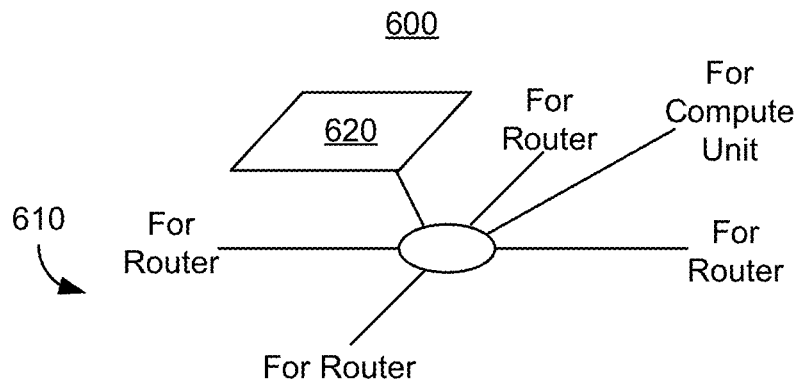
FIG. 6 depicts an embodiment of a router usable in a learning network.

FIG. 6 depicts an embodiment of router 600 usable in a learning network. For example, router 600 may be used as router 130, 230, 330, and/or 430 in computing devices 100, 200, 300, and/or 400, respectively. Router 600 includes an in-plane portion 610 and an out-of-plane portion 620. In-plane portion 610 includes connections to other routers and a compute unit. In-plane portion 610 also includes connections to out-of-plane portion 620. Thus, in-plane portion 610 of router 600 includes six physical connections. This is in contrast to a router (not shown) that is in-plane only, which includes five connections. Out-of-plane portion 620 couples wirelessly to layer(s) above and layer(s) below and includes a physical connection to in-plane portion 610. Out-of-plane portion 620 sends information to and receives information from router(s) (not shown) in both in layer(s) and in layer(s) below.

Router 600 may be used in computing devices 100, 200, 300, and/or 400. Thus, the benefits of computing devices 100, 200, 300, and/or 400 may be achieved. Router 600 is also includes fewer physical connections to in-plane portion 610. However, in-plane portion 610 has more physical connections and is more complex than a horizontal router.

Figure 7:
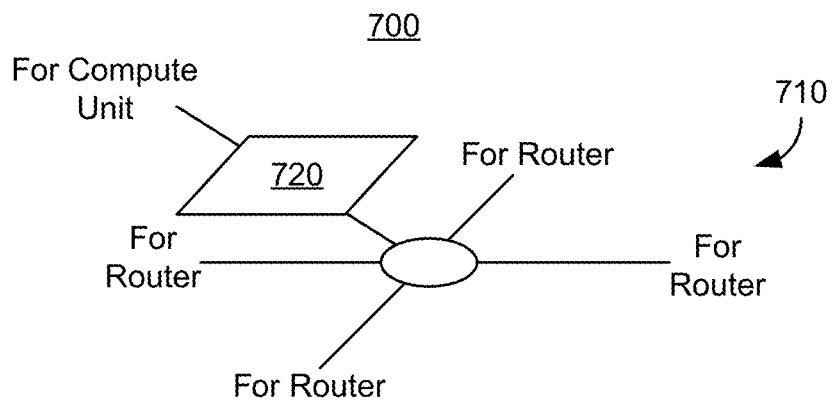
FIG. 7 depicts an embodiment of a router usable in a learning network.

FIG. 7 depicts an embodiment of router 700 usable in a learning network. For example, router 700 may be used as router 130, 230, 330, and/or 430 in computing devices 100, 200, 300, and/or 400, respectively. Router 700 includes an in-plane portion 710 and an out-of-plane portion 720. In-plane portion 710 includes connections to other routers and out-of-plane portion 720. Thus, in-plane portion 710 of router 700 includes five physical connections. This is the same as a router (not shown) that is in-plane only. Out-of-plane portion 720 includes two physical connections: one to a compute unit and one to in-plane portion 710. Thus, to send information to or from a compute unit, the information is transmitted through out-of-plane portion 720. Out-of-plane portion 720 also wirelessly couples to layer(s) above and layer(s) below. Out-of-plane portion 720 sends information to and receives information from router(s) (not shown) in both in layer(s) and in layer(s) below.

Router 700 may be used in computing devices 100, 200, 300, and/or 400. Thus, the benefits of computing devices 100, 200, 300, and/or 400 may be achieved. In-plane portion 710 of router 700 has fewer physical connections than in-plane portions 510 and 610. In-plane portion 710 of router 700 also has the same number of connections as a horizontal router.

Figure 8:
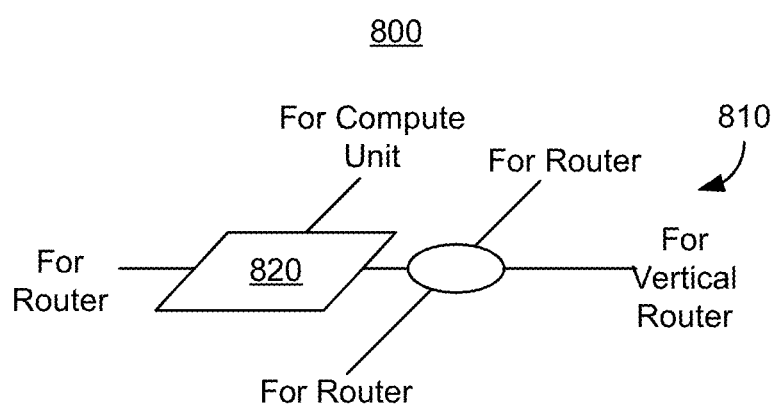
FIG. 8 depicts an embodiment of a router usable in a learning network.

FIG. 8 depicts an embodiment of router 800 usable in a learning network. For example, router 800 may be used as router 130, 230, 330, and/or 430 in computing devices 100, 200, 300, and/or 400, respectively. Router 800 includes an in-plane portion 810 and an out-of-plane portion 820. In-plane portion 810 includes connections to other routers and out-of-plane portion 820. Thus, in-plane portion 810 of router 800 includes four physical connections. Out-of-plane portion 820 includes three physical connections: one to a compute unit, one to another router, and one to in-plane portion 810. Thus, to send information to or from a compute unit, the information is transmitted through out-of-plane portion 820. Out-of-plane portion 820 also wirelessly couples to layer(s) above and layer(s) below. Out-of-plane portion 820 sends information to and receives information from router(s) (not shown) in both in layer(s) and in layer(s) below.

Router 800 may be used in computing devices 100, 200, 300, and/or 400. Thus, the benefits of computing devices 100, 200, 300, and/or 400 may be achieved. Router 800 is also less complex than routers 500, 600 and 600. Router 800 also has fewer physical connections as a horizontal router.

Figure 9:
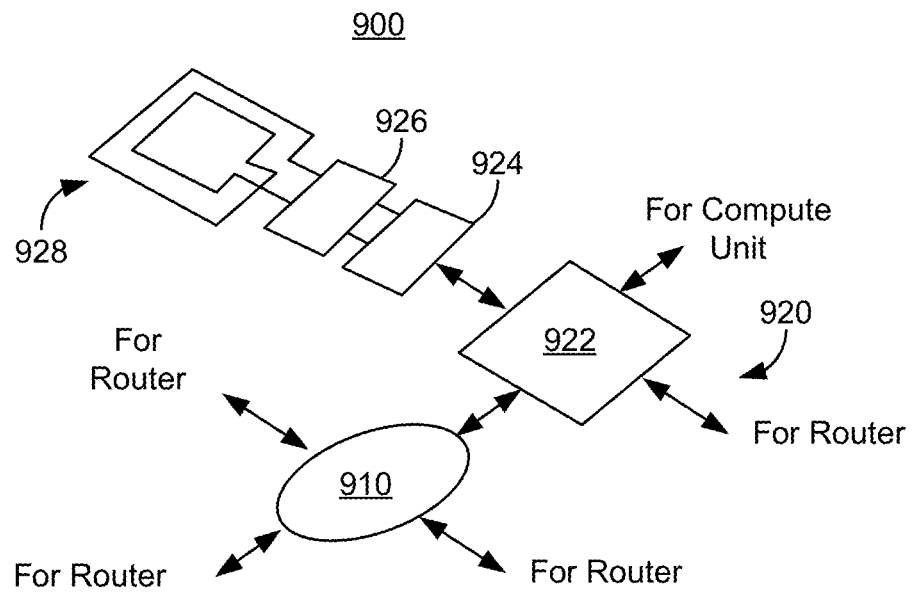
FIG. 9 depicts an embodiment of a router usable in a learning network.

FIG. 9 depicts an embodiment of router 900 usable in a learning network. For example, router 900 may be used as router 130, 230, 330, and/or 430 in computing devices 100, 200, 300, and/or 400, respectively. Router 900 is also analogous to router 800. Router 900 includes an in-plane portion 910 and an out-of-plane portion 920. In-plane portion 910 includes connections to other routers and out-of-plane portion 920. Thus, in-plane portion 910 of router 900 includes four physical connections. Out-of-plane portion 920 includes three physical connections: one to a compute unit, one to another router, and one to in-plane portion 910. Thus, to send information to or from a compute unit, the information is transmitted through out-of-plane portion 920. In other embodiments, another number of physical connections may be provided to in-plane portion 910 and/or out-of-plane portion 920. In such embodiments, router 900 may correspond to router 500, 600, or 700.

Out-of-plane portion 920 also wirelessly couples to layer(s) above and layer(s) below. Out-of-plane portion 920 sends information to and receives information from router(s) (not shown) in both in layer(s) and in layer(s) below. To do so, out-of-plane portion 920 includes components 922, 924, 926, and 928. Component 922 includes physical connections to a compute unit, another router, and to in-plane portion 910. Out-of-plane portion 920 includes inductive coupling interface 928. In some embodiments, inductive coupling interface 928 is a loop of wire. When energized, inductive coupling interface 928 may transmit information. Inductive coupling interface 928 may also receive information. Thus, inductive coupling interface 928 transfers information between both layer(s) above and layer(s) below the layer in which router 900 resides. Out-of-plane portion 920 may also include serializer/deserializer 924 and/or modulator/demodulator 926 for sending and receiving the information. Serializer/deserializer 924 serializes data for wireless transmission. Serializer/deserializer 924 also deserializes data received by inductive coupling interface 928. Modulator/demodulator 926 modulates data to be transmitted by inductive coupling interface 928. Modulator/demodulator 926 also demodulates data received by inductive coupling interface 928. In some embodiments, different frequencies and/or modulation schemes may be used by out-of-plane router 920 for transmission as for reception. Router 900 may be used in computing devices 100, 200, 300, and/or 400. Thus, the benefits of computing devices 100, 200, 300, and/or 400 may be achieved.

Figure 10:
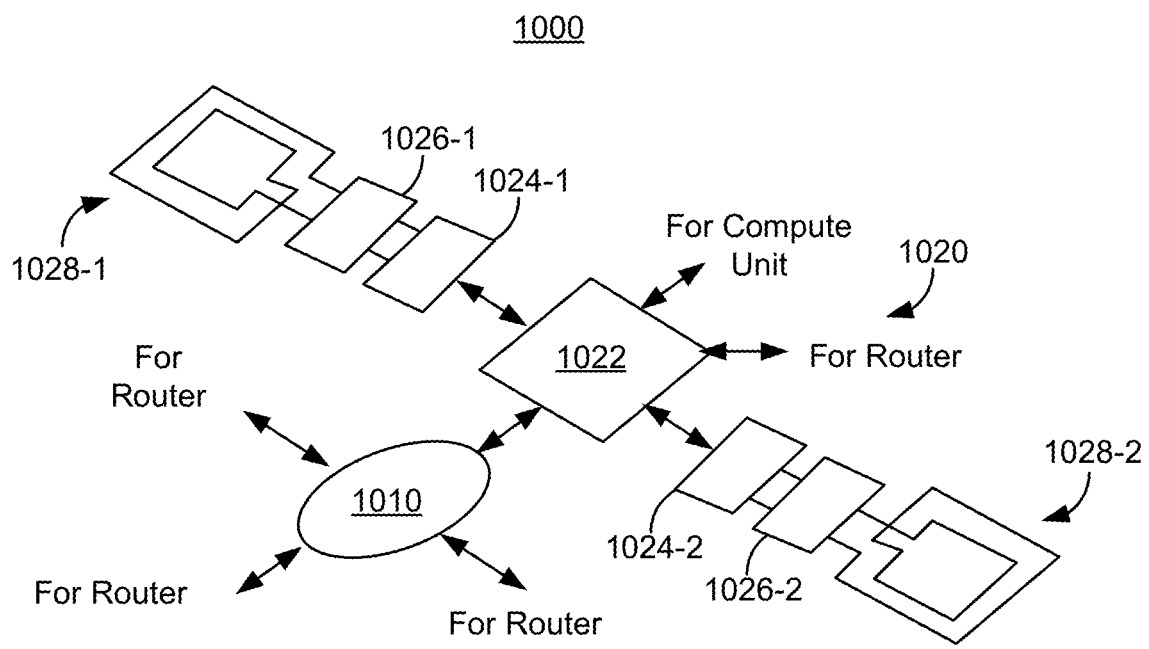
FIG. 10 depicts an embodiment of a router usable in a learning network.

FIG. 10 depicts an embodiment of router 1000 usable in a learning network. For example, router 1000 may be used as router 130, 230, 330, and/or 430 in computing devices 100, 200, 300, and/or 400, respectively. Router 1000 is analogous to router 900. Router 1000 includes an in-plane portion 1010 and an out-of-plane portion 1020. In-plane portion 1010 includes connections to other routers and out-of-plane portion 1020. Thus, in-plane portion 1010 of router 1000 includes four physical connections. Out-of-plane portion 1020 includes three physical connections: one to a compute unit, one to another router, and one to in-plane portion 1010. Thus, to send information to or from a compute unit, the information is transmitted through out-of-plane portion 1020. In other embodiments, another number of physical connections may be provided to in-plane portion 1010 and/or out-of-plane portion 1020. In such embodiments, router 1000 may correspond to router 500, 600, or 700.

Out-of-plane portion 1020 also wirelessly couples to layer(s) above and layer(s) below. Out-of-plane portion 1020 sends information to and receives information from router(s) (not shown) in both in layer(s) and in layer(s) below. Out-of-plane portion 1020 includes components 1022-1, 1024-1, 1028-1 and 1028-1 and components 1022-2, 1024-2, 1026-2, and 1028-2 that are analogous to components 922, 924, 926, and 928. Thus, out-of-plane portion includes inductive coupling interfaces 1028-1 and 1028-2. In some embodiments, each inductive coupling interface 1028-1 and 1028-2 is a loop of wire. Inductive coupling interfaces 1028-1 and 1028-2 may transmit and receive information. For example, inductive coupling interface 1028-1 may transmit information, while inductive coupling interface 1028-2 may receive information. In another example, inductive coupling interface 1028-1 may transmit information to and receive information from layers above the layer in which router 1000 resides. In this example, inductive coupling interface 1028-2 may transmit information to and receive information from layers below the layer in which router 1000 resides. Thus, inductive coupling interfaces 1028-1 and 1028-2 transfer information between both layer(s) above and layer(s) below the layer in which router 1000 resides. Out-of-plane portion 1020 may also include serializer/deserializers 1024-1 and 1024-2 and/or modulator/demodulators 1026-1 and 1026-2 that are each analogous to serializer/deserializer 924 and modulator/demodulator 926. Router 1000 may be used in computing devices 100, 200, 300, and/or 400. Thus, the benefits of computing devices 100, 200, 300, and/or 400 may be achieved.

FIGS. 11-16 depict embodiments of modules that may be used in compute units 120, 220, 320 and/or 420. In other embodiments, other CIM modules or components containing CIM modules may be used for compute units 120, 220, 320 and/or 420.

Figure 11:
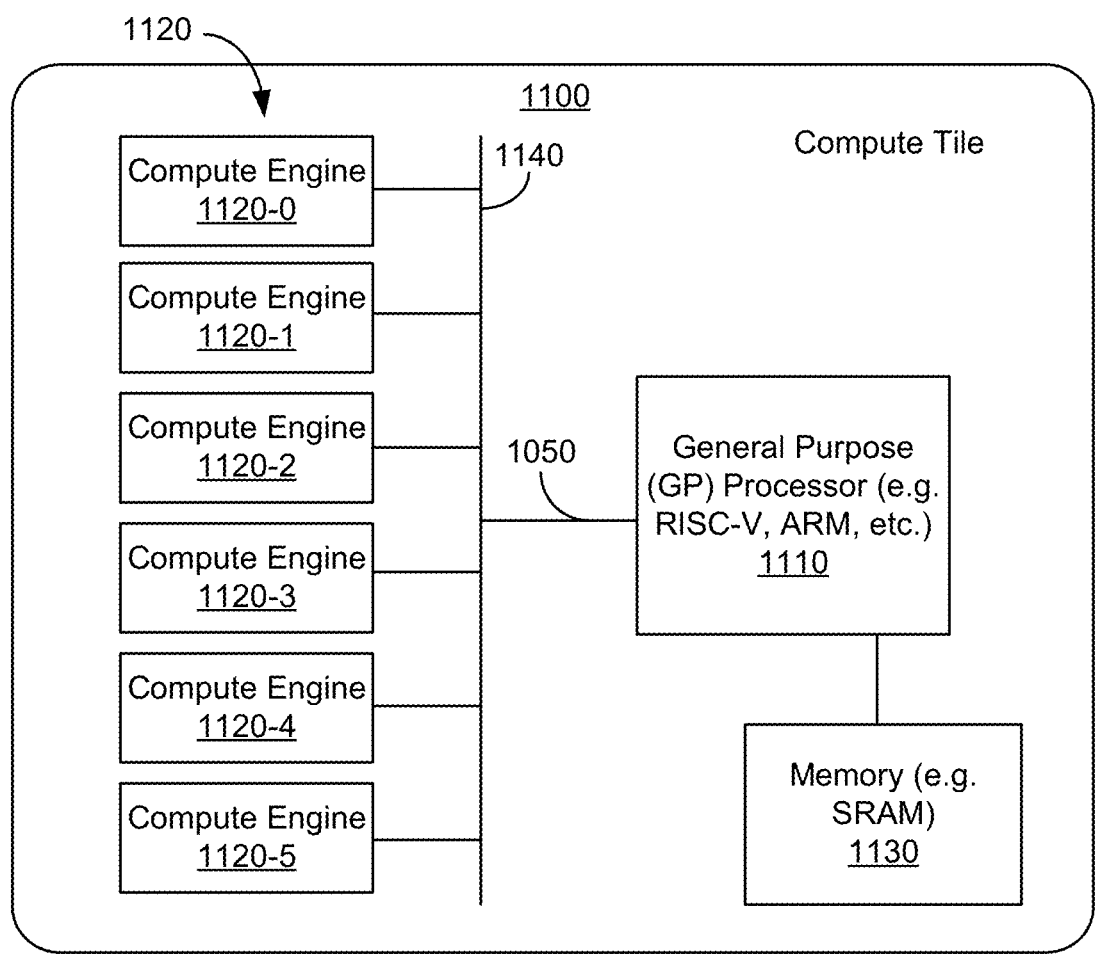
FIG. 11 is a diagram depicting an embodiment of a system usable in an AI accelerator and having an efficient architecture.

FIG. 11 is a diagram depicting an embodiment of system 1100 usable in a learning network. System 1100 is a compute tile and may be considered to be an artificial intelligence (AI) accelerator having an efficient architecture. Compute tile (or simply "tile") 1100 may be implemented as a single integrated circuit. Compute tile 1100 includes a general purpose (GP) processor 1110 and compute engines 1120-0 through 1120-5 (collectively or generically compute engines 1120). Although five compute engines 1120 are shown, in other embodiments another number may be included. GP processor 1110 is shown as being coupled with compute engines 1120 via compute bus (or other connector) 1140, and bus 1150. In other embodiments, GP processor 1110 may be connected with compute engines 1120 in another manner. In some embodiments, compute tile 1100 may include on-tile memory 1130. In other embodiments, memory 1130 may be omitted. Other components, for example a cache or another additional memory, module(s) for applying activation functions, modules for moving data (e.g. DMA), and/or other modules (e.g. SMID, mesh networking modules, etc.), may be present in compute tile 1100 in some embodiments.

GP processor 1110 is a reduced instruction set computer (RISC) processor. For example, GP processor 1110 may be a RISC-V processor or ARM processor. In other embodiments, different and/or additional general purpose processor(s) may be used. The GP processor 1110 provides control instructions and data to the compute engines 1120. GP processor 1110 implements instruction set(s) used in controlling compute engines 1120. GP processor 1110 provides the commands to compute engines 1120 and controls data movement to and/or from compute engines 1120. GP processor 1110 may thus function as part of a control plane for (i.e. providing commands and being part of the data path) compute engines 1120 and tile 1100.

In some embodiments, data is moved from memory 1130 or another source to compute engine(s) 1120 through GP processor 1110. Data may be sent from memory 1130 to internal memory of GP processor 1110, and then to the appropriate compute engine(s) 1120 via buses 1140 and 1150. For example, data from memory 1130 may be provided to a vector register file (not shown) of GP processor 1110 and then provided from GP processor 1110 to the appropriate compute engine(s) 1120. Once compute engines 1120 have performed their functions, the output is provided to GP processor 1110. Similarly, data may be moved from compute engines 1120 to memory 1130 or another destination via GP processor 1110. Thus, GP processor 1110 may be part of both the control plane and data plane for compute tile 1100.

GP processor 1110 may also perform other functions. GP processor 1110 may apply activation function(s) to data. For example, an activation function (e.g. a ReLu, Tanh, and/or SoftMax) may be applied to the output of compute engine(s) 1120. Thus, GP processor 1110 may perform nonlinear operations. GP processor 1110 may also perform linear functions and/or other operations. However, GP processor 1110 is still desired to have reduced functionality as compared to, for example, a graphics processing unit (GPU) or central processing unit (CPU) of a computer system with which tile 1100 might be used.

Compute engines 1120 are configured to perform, efficiently and in parallel, tasks that may be part of using (e.g. performing inferences) and/or training (e.g. performing inferences and/or updating weights) a model. Compute engines 1120 are coupled with and receive commands and, in at least some embodiments, data from GP processor 1110. Compute engines 1120 are modules which perform vector-matrix multiplications (VMMs) in parallel. Thus, compute engines 1120 may perform linear operations. Each compute engine 1120 includes a compute-in-memory (CIM) hardware module (not specifically shown in FIG. 11). The CIM hardware module stores weights corresponding to a matrix and is configured to perform a VMM in parallel for the matrix. Compute engines 1120 may also include local update (LU) module(s) (not specifically shown in FIG. 11). Such LU module(s) allow compute engines 1120 to update weights stored in the CIM.

The CIM module is a hardware module that stores data and performs operations. In some embodiments, CIM module stores weights for the model. As such, the CIM module determines the maximum size of the model that can be handled by compute tile 1100 (i.e. the maximum number of parameters, or weights). The CIM module stores the weights (or other data) in cells that are fully addressable. The CIM module also performs operations using the weights. More specifically, the CIM module performs VMMs, where the vector may be an input vector (e.g. an activation) provided using GP processor 1110 and the matrix may be weights (i.e. data/parameters) stored by the CIM module. The CIM module may be considered to include a memory (e.g. that stores the weights) and compute hardware (e.g. that performs the vector-matrix multiplication of the stored weights). In some embodiments, the vector may be a matrix. The CIM module may include an analog SRAM having multiple SRAM cells and configured to provide output(s) (e.g. voltage(s)) corresponding to the data (weight/parameter) stored in each cell of the SRAM multiplied by a corresponding element of the input vector. In some embodiments, the CIM module may include a digital SRAM having multiple SRAM cells and configured to provide output(s) corresponding to the data (weight/parameter) stored in each cell of the digital SRAM multiplied by a corresponding element of the input vector. Other configurations of CIM modules are possible. Each CIM module thus stores weights corresponding to a matrix in its cells and is configured to perform a vector-matrix multiplication of the matrix with an input vector. In some embodiments, the CIM module of a compute engine 1120 may be repurposed as memory if the compute engine utilization falls below a particular threshold (e.g. 70%-80%). For example, the CIM might store duplicate weights or vectors (e.g. activations) in such embodiments.

In order to facilitate on-chip learning, local update (LU) modules (not shown) may also be provided in compute engines 1120. LU modules are coupled with the corresponding CIM modules. LU modules are used to update the weights (or other data) stored in the CIM modules. LU modules are considered local because LU modules are in proximity to CIM modules. For example, LU module(s) for a particular compute engine 1120 may reside in the same integrated circuit as the CIM module(s) for compute engine 1120. In some embodiments, the LU module is considered local because it is fabricated on the same substrate (e.g. the same silicon wafer) as the corresponding CIM module. In some embodiments, LU modules are also used in determining the weight updates. In other embodiments, a separate component may calculate the weight updates. For example, in addition to or in lieu of LU modules, the weight updates may be determined by GP processor 1110, in software by other processor(s) not part of compute tile 1100, by other hardware that is part of compute tile 1100, by other hardware outside of compute tile 1100, and/or some combination thereof.

Memory 1130 may be or include a static random access memory (SRAM) and/or some other type of memory. Memory 1130 is shown as coupled with GP processor 1110. Stated differently, data movement between memory 1130 and compute engines 1120 may take place via GP processor 1120. In some embodiments, memory 1130 may be coupled to compute bus 1140 (i.e. to compute engines 1120). Memory 1130 may store activations (e.g. input vectors provided to compute tile 1100 and the resultant of activation functions applied to the output of compute engines 1120). Memory 1130 may also store weights. For example, memory 1130 may contain a backup copy of the weights or different weights if the weights stored in compute engines 1120 are desired to be changed. In some embodiments, memory 1130 is organized into banks of cells (e.g. banks of SRAM cells). In such embodiments, specific banks of memory 1130 may service specific one(s) of compute engines 1120. In other embodiments, banks of memory 1130 may service any compute engine 1120.

In operation, an input vector is provided to one or more of compute engines 1120 by GP processor 1110. The input vector is desired to be multiplied by the weights, which may have been previously stored in compute engine(s) 1120. An input vector may be provided to multiple compute engines 1120 if the weight matrix and/or input vector have too many elements for a single compute engine. In some such embodiments, a portion of the input vector is provided to each of the multiple compute engines 1120 (each of which stores a portion of the weights). In some embodiments, the input vector is provided from memory 1130 to GP processor 1110 and from GP processor 1110 to compute engine(s) 1120. GP processor 1110 also instructs compute engine(s) 1120 to perform a VMM. Compute engine(s) 1120 perform a VMM between the input vector and the matrix of weights to provide an output. The VMM is performed in parallel for the elements of the input vector. The output of compute engine(s) 1120 may be considered an output vector. The output is provided by compute engine(s) 1120 to GP processor 1110. For example, the output may be stored in a vector register file of GP processor 1110. GP processor 1110 may also store the output (e.g. in memory 1130) and/or may provide the output to another component off-tile. GP processor 1110 may apply a function (e.g. an activation function) to the output. The results of the activation function applied to the output of compute engines 1120 may be stored in GP processor 1110 (e.g. in a buffer or the vector register file). GP processor 1110 may also store the results in memory 1130 or off-tile. GP processor 1110 may provide the results as an input vector to other compute engine(s) 1120 to apply a different set of weights to the results where another set of weights are stored in other compute engine(s) 1120. Thus, one or more inferences with one or more distinct sets of weights may be performed. In some embodiments, training may also be performed by tile 1100. In some such embodiments, GP processor 1110 or another component (such as a host) may determine the desired update for the weights. In some embodiments, LU module (not shown) of compute engines 1120 may be used to determine and apply the updates to the weights.

Thus, compute tile 1100 includes two compute blocks, GP processor 1110 and compute engines 1120, which work together. GP processor 1110 may perform nonlinear operations (e.g. activation functions) and compute engines perform 1120 may perform linear operations (e.g. VMMs). GP processor 1110 is in the control and data planes for compute engines 1120. GP processor 1110 and compute engines 1120 are, therefore, tightly coupled. Consequently, data may be moved more efficiently within tile 1100. Operations, such as VMMs and the application of activation functions to the output of compute engines 1120, may be more efficiently performed. Further, a special purpose controller need not be designed and fabricated for compute tile 1100. Instead, GP processor 1110 is used. As a result, compute tile 1100 may be more flexible and more readily designed and fabricated. For example, the activation applied by GP processor 1110 may be updated by updating GP processor 1110. A new special purpose controller need not be provided. Consequently, functions for machine learning may be more efficiently and readily performed. In addition, compute tile 1100 includes on-tile memory 1130. Use of on-tile memory, for example as a scratchpad memory, allows for a high degree of independence of compute tile 1100 from other components (e.g. other tiles). Thus, multiple tiles 1100 may more readily work in parallel. Consequently, efficiency of learning may be enhanced.

Figure 12:
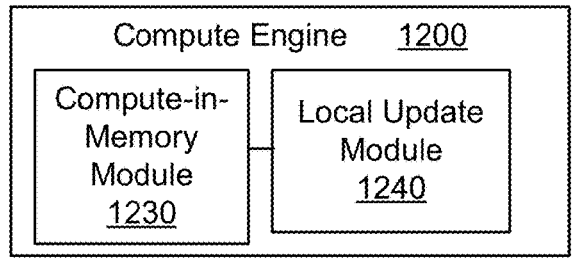
FIG. 12 depicts an embodiment of a portion of a compute engine usable in an AI accelerator.
Figure 13:
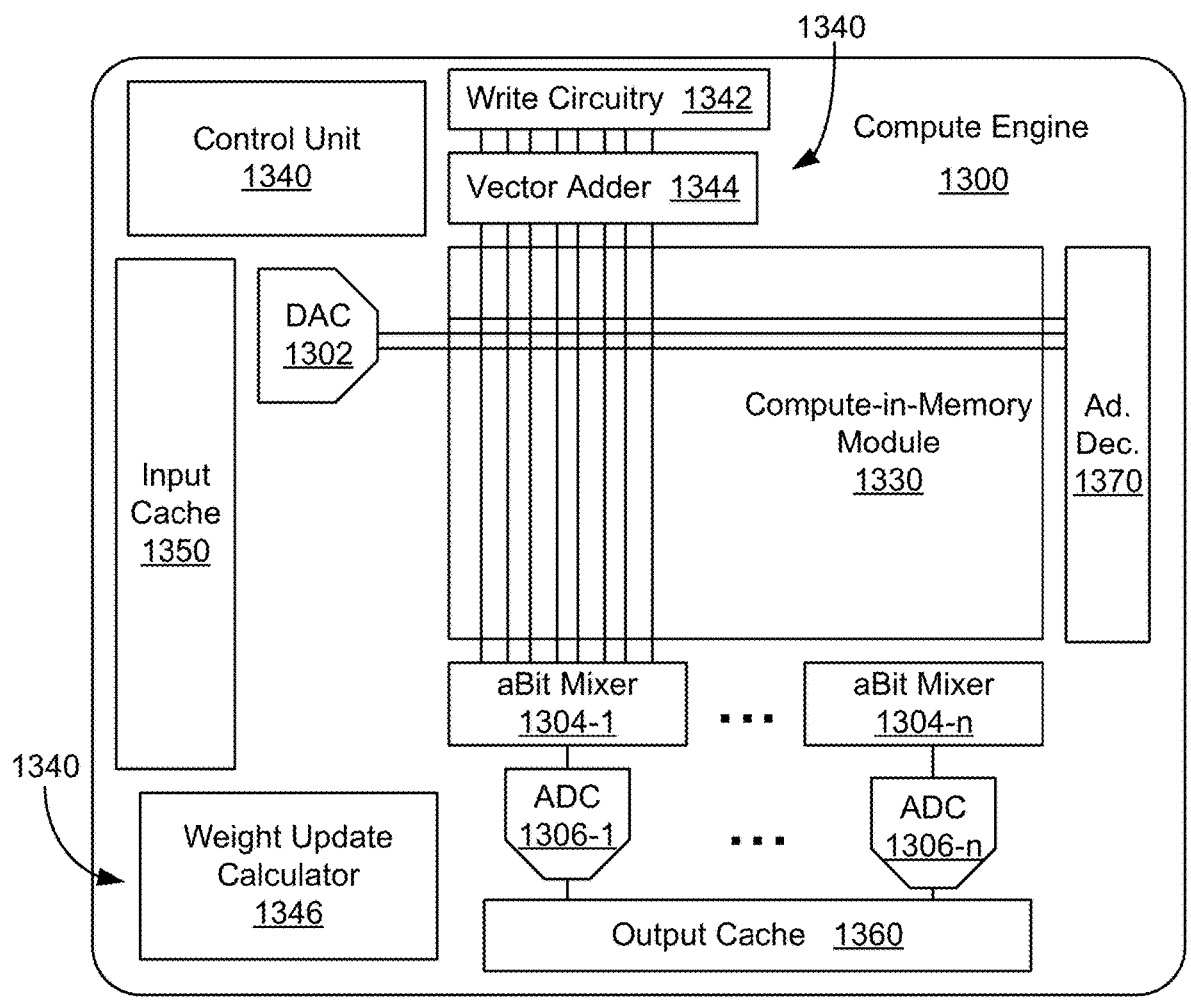
FIG. 13 depicts an embodiment of a portion of a compute engine usable in an AI accelerator and capable of performing local updates.

FIG. 12 depicts compute engine 1200 usable in an AI accelerator. Compute engine 1200 may be part of an AI accelerator that can be deployed for using a model (not explicitly depicted) and for allowing for on-chip training of the model (otherwise known as on-chip learning). Compute engine 1200 may thus be used as compute engine(s) 1120 and/or as compute unit(s) 120, 220, 320, and/or 420. Compute engine 1200 includes CIM module 1230 and LU module 1240. Although one CIM module 1230 and one LU module 1240 is shown, a compute engine may include another number of CIM modules 1230 and/or another number of LU modules 1240. For example, a compute engine might include three CIM modules 1230 and one LU module 1240, one CIM module 1230 and two LU modules 1240, or two CIM modules 1230 and two LU modules 1240.

CIM module 1230 is a hardware module that stores data and performs operations. In some embodiments, CIM module 1230 stores weights for the model. CIM module 1230 also performs operations using the weights. More specifically, CIM module 1230 performs vector-matrix multiplications, where the vector may be an input vector provided using processor 110 and the matrix may be weights (i.e. data/parameters) stored by CIM module 1230. Thus, CIM module 1230 may be considered to include a memory (e.g. that stores the weights) and compute hardware (e.g. that performs the vector-matrix multiplication of the stored weights). In some embodiments, the vector may be a matrix (i.e. an n×m vector where n>1 and m>1). For example, CIM module 1230 may include an analog static random access memory (SRAM) having multiple SRAM cells and configured to provide output(s) (e.g. voltage(s)) corresponding to the data (weight/parameter) stored in each cell of the SRAM multiplied by a corresponding element of the input vector. In some embodiments CIM module 1230 may include a digital static SRAM having multiple SRAM cells and configured to provide output(s) corresponding to the data (weight/parameter) stored in each cell of the digital SRAM multiplied by a corresponding element of the input vector. In some embodiments, CIM module 1230 may include an analog resistive random access memory (RAM) configured to provide output (e.g. voltage(s)) corresponding to the impedance of each cell multiplied by the corresponding element of the input vector. Other configurations of CIM module 530 are possible. Each CIM module 1230 thus stores weights corresponding to a matrix in its cells and is configured to perform a vector-matrix multiplication of the matrix with an input vector.

In order to facilitate on-chip learning, LU module 1240 may be provided. LU module 1240 is coupled with the corresponding CIM module 1230. LU module 1240 is used to update the weights (or other data) stored in CIM module 1230. LU module 1240 is considered local because LU module 1240 is in proximity with CIM module 1230. For example, LU module 1240 may reside on the same integrated circuit as CIM module 1230. In some embodiments LU module 1240 for a particular compute engine resides in the same integrated circuit as the CIM module 1230. In some embodiments, LU module 1240 is considered local because it is fabricated on the same substrate (e.g. the same silicon wafer) as the corresponding CIM module 1230. In some embodiments, LU module 1240 is also used in determining the weight updates. In other embodiments, a separate component may calculate the weight updates. For example, in addition to or in lieu of LU module 1240, the weight updates may be determined by a GP processor, in software by other processor(s) not part of compute engine 1200 and/or the corresponding AI accelerator (e.g. compute tile 100, 200, or 300), by other hardware that is part of compute engine 1200 and/or the corresponding AI accelerator (e.g. compute tile 100, 200, or 300), by other hardware outside of compute engine 1200 or the corresponding AI accelerator (e.g. compute tile 100, 200, or 300), and/or some combination thereof.

Using compute engine 1200 in the context of compute tiles 100, compute units 120, 220, 320, and/or 420, and/or an analogous system, efficiency and performance of a learning network may be improved. Use of CIM modules 1230 may dramatically reduce the time to perform the vector-matrix multiplication that provides the weighted signal. Thus, performing inference(s) using compute engine 1200 may require less time and power. This may improve efficiency of training and use of the model. LU modules 1240 allow for local updates to the weights in CIM modules 1230. This may reduce the data movement that may otherwise be required for weight updates. Consequently, the time taken for training may be greatly reduced. In some embodiments, the time taken for a weight update using LU modules 1240 may be an order of magnitude less (i.e. require one-tenth the time) than if updates are not performed locally. Efficiency and performance of a learning network provided using system 100 may be increased.

Figure 14:
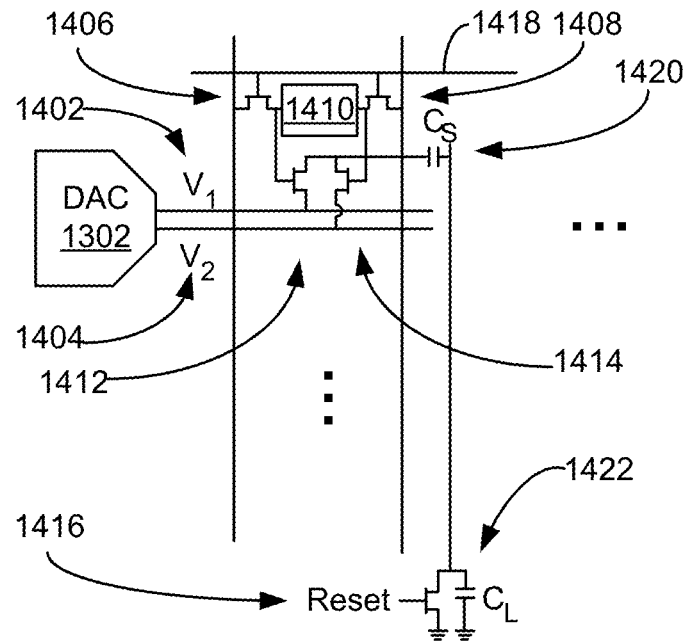
FIG. 14 depicts an embodiment of a portion of a compute-in-memory module usable in an AI accelerator. (SRAM)

FIG. 14 depicts an embodiment of a cell in one embodiment of an SRAM CIM module usable for CIM module 1330. Also shown is DAC 1302 of compute engine 1300. For clarity, only one SRAM cell 1410 is shown. However, multiple SRAM cells 1410 may be present. For example, multiple SRAM cells 1410 may be arranged in a rectangular array. An SRAM cell 1410 may store a weight or a part of the weight. The CIM module shown includes lines 1402, 1404, and 1418, transistors 1406, 1408, 1412, 1414, and 1416, capacitors 1420 (Cs) and 1422 (CL). In the embodiment shown in FIG. 14, DAC 1302 converts a digital input voltage to differential voltages, $V_1$ and $V_2$, with zero reference. These voltages are coupled to each cell within the row. DAC 1302 is thus used to temporal code differentially. Lines 1402 and 1404 carry voltages $V_1$ and $V_2$, respectively, from DAC 1302. Line 1418 is coupled with address decoder 1370 (not shown in FIG. 14) and used to select cell 1410 (and, in the embodiment shown, the entire row including cell 1410), via transistors 1406 and 1408.

In operation, voltages of capacitors 1420 and 1422 are set to zero, for example via Reset provided to transistor 1416. DAC 1302 provides the differential voltages on lines 1402 and 1404, and the address decoder (not shown in FIG. 14) selects the row of cell 1410 via line 1418. Transistor 1412 passes input voltage $V_1$ if SRAM cell 1410 stores a logical 1, while transistor 1414 passes input voltage $V_2$ if SRAM cell 1410 stores a zero. Consequently, capacitor 1420 is provided with the appropriate voltage based on the contents of SRAM cell 1410. Capacitor 1420 is in series with capacitor 1422. Thus, capacitors 1420 and 1422 act as capacitive voltage divider. Each row in the column of SRAM cell 1410 contributes to the total voltage corresponding to the voltage passed, the capacitance, Cs, of capacitor 1420, and the capacitance, CL, of capacitor 1422. Each row contributes a corresponding voltage to the capacitor 1422. The output voltage is measured across capacitor 1422. In some embodiments, this voltage is passed to the corresponding aBit mixer 504 for the column. In some embodiments, capacitors 1420 and 1422 may be replaced by transistors to act as resistors, creating a resistive voltage divider instead of the capacitive voltage divider. Thus, using the configuration depicted in FIG. 14, CIM module 1330 may perform a vector-matrix multiplication using data stored in SRAM cells 1410.

Figure 15:
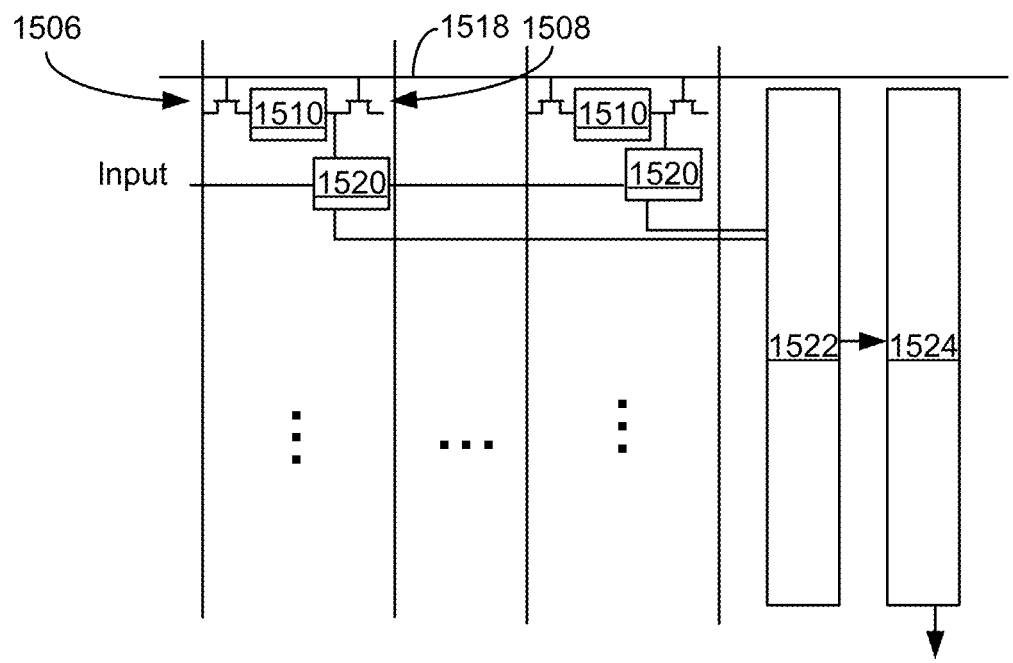
FIG. 15 depicts an embodiment of a portion of a compute-in-memory module usable in an AI accelerator. (SRAM)

FIG. 15 depicts an embodiment of a cell in one embodiment of a digital SRAM module usable for CIM module 1330. For clarity, only one digital SRAM cell 1510 is labeled. However, multiple cells 1510 are present and may be arranged in a rectangular array. Also labeled are corresponding transistors 1506 and 1508 for each cell, line 1518, logic gates 1520, adder tree 1522 and digital mixer 1524. Because the SRAM module shown in FIG. 15 is digital, DACs 1302, aBit mixers 1304, and ADCs 1306 may be omitted from compute engine 1300 depicted in FIG. 13.

In operation, a row including digital SRAM cell 1510 is enabled by address decoder 1370 (not shown in FIG. 15) using line 1518. Transistors 1506 and 1508 are enabled, allowing the data stored in digital SRAM cell 1510 to be provided to logic gates 1520. Logic gates 1520 combine the data stored in digital SRAM cell 1510 with the input vector. Thus, the binary weights stored in digital SRAM cells 1510 are combined with the binary inputs. The output of logic gates 1520 are accumulated in adder tree 1522 and combined by digital mixer 1524. Thus, using the configuration depicted in FIG. 15, CIM module 1330 may perform a vector-matrix multiplication using data stored in digital SRAM cells 1510.

Referring back to FIG. 13, CIM module 1330 thus stores weights corresponding to a matrix in its cells and is configured to perform a vector-matrix multiplication of the matrix with an input vector. In some embodiments, compute engine 1300 stores positive weights in CIM module 1330. However, the use of both positive and negative weights may be desired for some models and/or some applications. In such cases, bipolar weights (e.g. having range −S through +S) are mapped to a positive range (e.g. 0 through S). For example, a matrix of bipolar weights, W, may be mapped to a positive weight matrix $W_p$ such that: $Wx = (W_p - SJ/2)(2x) = 13 W_p x - S\Sigma_i x_i$. where J is a matrix of all ones having the same size as W and S is the maximum value of the weight (e.g. $2^{N-1}$ for an N-bit weight). For simplicity, compute engine 1300 is generally discussed in the context of CIM module 1330 being an analog SRAM CIM module analogous to that depicted in FIG. 14.

Input cache 1350 receives an input vector for which a vector-matrix multiplication is desired to be performed. In some embodiments, the input vector is provided to input cache by a GP processor, such as GP processor 110. The input vector may be read from a memory, from a cache or register in the processor, or obtained in another manner. Digital-to-analog converter (DAC) 1302 converts a digital input vector to analog in order for CIM module 1330 to operate on the vector. Although shown as connected to only some portions of CIM module 1330, DAC 1302 may be connected to all of the cells of CIM module 1330. Alternatively, multiple DACs 1302 may be used to connect to all cells of CIM module 1330. Address decoder 1370 includes address circuitry configured to selectively couple vector adder 1344 and write circuitry 1342 with each cell of CIM module 1330. Address decoder 1370 selects the cells in CIM module 1330. For example, address decoder 1370 may select individual cells, rows, or columns to be updated, undergo a vector-matrix multiplication, or output the results. In some embodiments, aBit mixer 1304 combines the results from CIM module 1330. Use of aBit mixer 1304 may save on ADCs 1306 and allows access to analog output voltages.

ADC(s) 1306 convert the analog resultant of the vector-matrix multiplication to digital form. Output cache 1360 receives the result of the vector-matrix multiplication and outputs the result from compute engine 1300. Thus, a vector-matrix multiplication may be performed using CIM module 1330.

LU module 1340 includes write circuitry 1342 and vector adder 1344. In some embodiments, LU module 1340 includes weight update calculator 1346. In other embodiments, weight update calculator 1346 may be a separate component and/or may not reside within compute engine 1300. Weigh update calculator 1346 is used to determine how to update to the weights stored in CIM module 1330. In some embodiments, the updates are determined sequentially based upon target outputs for the learning system of which compute engine 1300 is a part. In some embodiments, the weight update provided may be sign-based (e.g. increments for a positive sign in the gradient of the loss function and decrements for a negative sign in the gradient of the loss function). In some embodiments, the weight update may be ternary (e.g. increments for a positive sign in the gradient of the loss function, decrements for a negative sign in the gradient of the loss function, and leaves the weight unchanged for a zero gradient of the loss function). Other types of weight updates may be possible. In some embodiments, weight update calculator 1346 provides an update signal indicating how each weight is to be updated. The weight stored in a cell of CIM module 1330 is sensed and is increased, decreased, or left unchanged based on the update signal. In particular, the weight update may be provided to vector adder 1344, which also reads the weight of a cell in CIM module 1330. More specifically, adder 1344 is configured to be selectively coupled with each cell of CIM module by address decoder 1370. Vector adder 1344 receives a weight update and adds the weight update with a weight for each cell. Thus, the sum of the weight update and the weight is determined. The resulting sum (i.e. the updated weight) is provided to write circuitry 1342. Write circuitry 1342 is coupled with vector adder 1344 and the cells of CIM module 1330. Write circuitry 1342 writes the sum of the weight and the weight update to each cell. In some embodiments, LU module 1340 further includes a local batched weight update calculator (not shown in FIG. 13) coupled with vector adder 1344. Such a batched weight update calculator is configured to determine the weight update.

Compute engine 1300 may also include control unit 1340. Control unit 1340 generates the control signals depending on the operation mode of compute engine 1300. Control unit 1340 is configured to provide control signals to CIM hardware module 1330 and LU module 1349. Some of the control signals correspond to an inference mode. Some of the control signals correspond to a training, or weight update mode. In some embodiments, the mode is controlled by a control processor (not shown in FIG. 13, but analogous to processor 110) that generates control signals based on the Instruction Set Architecture (ISA).

In inference mode, the input data is multiplied by the stored weights and output is obtained after ADC 1306. This mode may include many steps. For example, if capacitors arranged in a voltage divider are used to provide the output (e.g. in FIG. 6), the capacitors (or other storage elements) may be reset. For example, capacitors are rest to either zero or certain precharge value depending on the functionality of the capacitor. Capacitive voltage divider operation is enabled to provide the output of the vector-matrix-multiplication. aBit mixer 1304 is enabled. ADC(s) 1306 are also enabled. Data are stored in output cache 1360 to be passed to the compute engine or other desired location(s). This process may be repeated for the entire vector multiplication. In weight update mode, the weight update signals may be generated sequentially by weight update calculator 1346. In parallel, cells in a row of CIM module 1330 are read row by row and passed to adder 1344 for the corresponding weight update.

Using compute engine 1300, efficiency and performance of a learning network may be improved. CIM module 1330 may dramatically reduce the time to perform the vector-matrix multiplication. Thus, performing inference(s) using compute engine 1300 may require less time and power. This may improve efficiency of training and use of the model. LU module 1340 uses components 1342, 1344, and 1346 to perform local updates to the weights stored in the cells of a CIM module 1330. This may reduce the data movement that may otherwise be required for weight updates. Consequently, the time taken for training may be dramatically reduced. Efficiency and performance of a learning network provided using compute engine 1300 may be increased.

Figure 16:
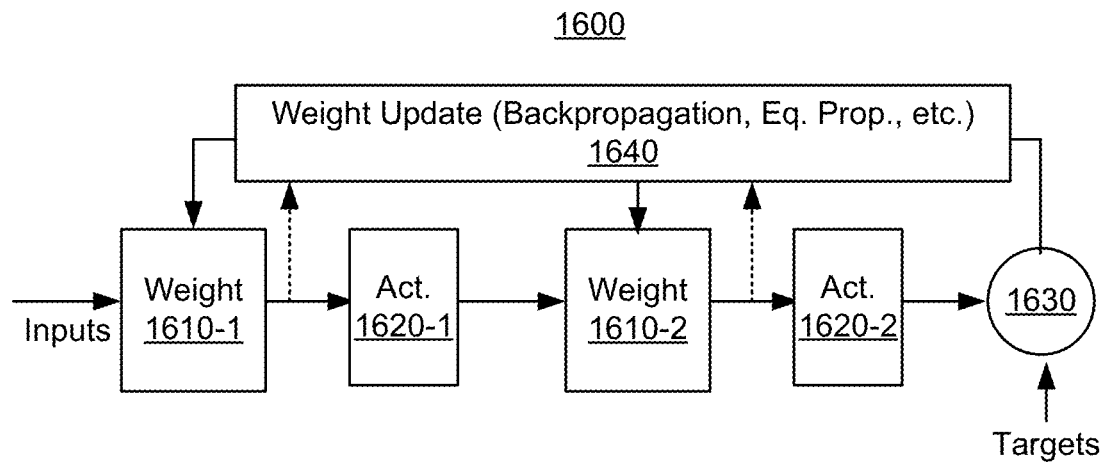
FIG. 16 depicts an embodiment of the data flow in a learning network.

For example, FIG. 16 depicts an embodiment of data flow in learning network 1600 that can be implemented using compute tile 1100 and/or compute engine(s) 1200 and/or 1300. Learning network 1600 includes weight layers 1610-1 and 1610-2 (collectively or generically 1610) and activation layers 1620-1 and 1620-2 (collectively or generically 1620). For training, loss function calculator 1630 as well as weight update block 1640 are shown. Weight update block 1640 might utilize techniques including but not limited to back propagation, equilibrium propagation, feedback alignment and/or some other technique (or combination thereof). In operation, an input vector is provided to weight layer 1610-1. A first weighted output is provided from weight layer 1610-1 to activation layer 1620-1. Activation layer 1620-1 applies a first activation function to the first weighted output and provides a first activated output to weight layer 1620-2. A second weighted output is provided from weight layer 1610-2 to activation layer 1620-2. Activation layer 1620-2 applies a second activation function to the second weighted output. The output is provided to loss calculator 1630. Using weight update technique(s) 1640, the weights in weight layer(s) 1610 are updated. This continues until the desired accuracy is achieved.

Compute tile(s) 100 and compute engine(s) 1200, and/or 1300 may be used to accelerate the processes of learning network 1600. For simplicity, it is assumed that compute engine 1300 is used in compute tile 1200. Further, weight layers 1610 are assumed to be storable within a single CIM module 1330. Nothing prevents weight layers 1610 from being extended across multiple CIM modules 1330. In the data flow described above for learning network 1600, an input vector is provided to a compute engine 1120-1 from GP processor 1110. More specifically, the input vector is provided to CIM module 1330 (e.g. via input cache 1350 and DAC(s) 1302). Initial values of weights are stored in, for example, SRAM cells (e.g. 1410 or 1510) of CIM module 1330. A vector matrix multiplication is performed by CIM module 1330 and provided to output cache 1360 (e.g. also using aBit mixers 1304 and ADC(s) 1306). Thus, the processes of weight layer 1610-1 may be performed. Activation layer 1620-1 may be performed using a GP processor 1110. The output of activation layer 1620-1 (e.g. from GP processor 1110) is provided to the next weight layer 1610-2. Initial weights for weight layer 1610-2 may be in another compute engine 1130-2/CIM module 1330. In another embodiment, new weights corresponding to weight layer 1610-2 may be stored in the same hardware CIM module 1330 of the same compute engine 1130-1. A vector matrix multiplication is performed by CIM module 1330 and provided to output cache 1360 (e.g. also using aBit mixers 1304 and ADC(s) 1306). Activation layer 1620-2 may be performed using a processor such as GP processor 1110. The output of activation layer 1620-2 is used to determine the loss function via hardware or GP processor 1110. The loss function may be used to determine the weight updates by GP processor 1110, weight update calculator 1246. Using LU modules 1340 and the weights in CIM modules 1330, weight layers 1610 may be updated. Thus, learning network 1600 may be realized using compute tile 100 and/or compute engine 1300. The benefits thereof may, therefore, be obtained.

Figure 17:
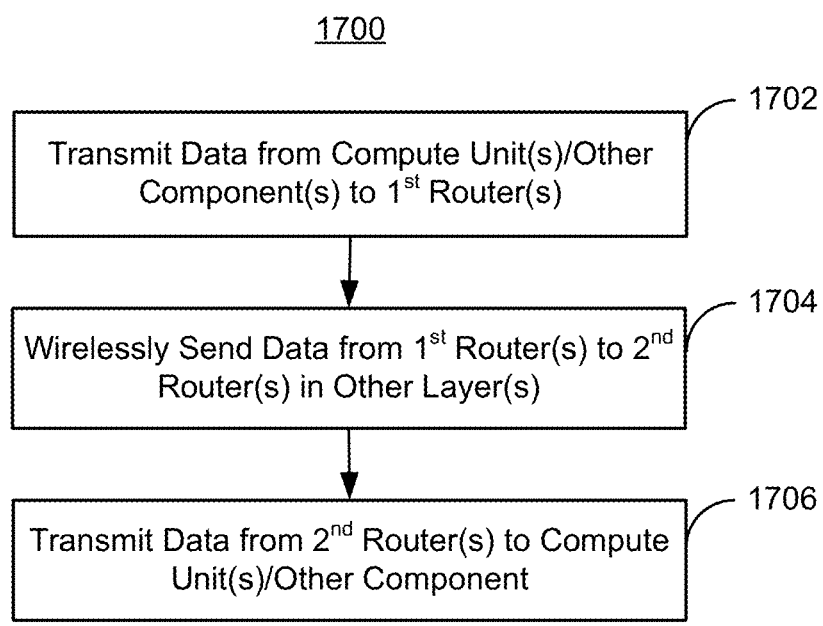
FIG. 17 is a flow chart depicting one embodiment of a method for transmitting data between layers in a computing device.

FIG. 17 is a flow chart depicting one embodiment of method 1700 for transmitting data between layers in a computing device. Method 1700 is described in the context of computing device 100. However, method 1700 is usable with other computing devices, such as computing devices 200, 300, and/or 400. Although particular processes are shown in an order, the processes may be performed in another order, including in parallel. Further, processes may have substeps.

Information is transmitted from at least a first compute unit of a first array of compute units in a layer to at least a first router of a first array of routers in the layer, at 1702. In some cases, 1702 includes multiple transfers. Stated differently, the information may be transferred from a particular compute unit to a physically connected router, then to another router that is capable of transferring information to another layer. Because they are in the same layer, the first array of compute units and the first array of routers are on the same substrate. The first array of compute units includes CIM modules. The first array of routers transmits information within the layer (i.e. in-plane or horizontally).

The router(s) in the first array of routers wirelessly sends the information from the first router(s) to at least a second router of a second array of routers, at 1704. In some embodiments, 1704 includes serializing the data and/or modulating the data by the first router( ) to provide a modulated electrical signal for wireless transmission. The second array of routers and a second array of compute units are arranged on a second substrate and part of a second layer. The second substrate is disposed vertically from the first substrate. The second layer may be next to the first layer. In some cases, the second layer is separated from the first layer by one or more intervening layers. Thus, the transmission at 1704 is from the first layer to the second layer. The first and second routers transfer information between layers (i.e. out-of-plane or vertically). In some embodiments, 1704 may include demodulating and deserializing the data at the second router(s). The second array of compute units includes CIM modules. The second array of routers also transmits information within the layer (i.e. in-plane or horizontally).

In some embodiments, the information is sent from the second router to a second compute unit in the second array of compute units, at 1706. In some cases, 1706 includes multiple transfers. Stated differently, the information may be transferred from the second router(s) to other router(s) in the layer and to a particular compute unit to a physically connected router. In some embodiments 1706 may include sending the data off of the computing system. For example, the data may be transmitted to another computing system and/or to a host.

For example, computing system 100 may utilize method 1700 to transmit data between layers 110. In such embodiments, 1702 may include sending data from a compute unit 120 to the appropriate router(s) 130 in layer 110-2 (for example). At 1704, router 130 in layer 110-2 may serialize and/or modulate the data. Also at 1704, router 130 wirelessly transmits the information to router 130 in layer 110-0. This may include energizing a wireless inductively coupled interface 928, 1028-1, and/or 1028-2 for the router 130 in layer 110-2. The router 130 of layer 110-0 receives the data. In some embodiments, inductively coupled interface 928, 1028-1 and/or 1028-2 for router 130 in layer 110-0 picks up the information. In addition, router 130 may demodulate and/or serialize the received information. Router 130 may transfer the data to another component in layer 110-0. For example, the data may be transferred to another router 130 and/or compute unit(s) 120 in layer 110-0.

Thus, using method 1700 data may be transferred between layers of a computing device, such as a hardware AI accelerator. Consequently, some or all of the benefits described herein may be achieved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A computing device, comprising:
   a first array of compute units arranged on a first substrate, the first array of compute units including a first plurality of compute-in-memory (CIM) modules;
   a first array of routers configured to route information horizontally among the first array of compute units on the first substrate;
   a second array of compute units arranged on a second substrate, the second array of compute units including a second plurality of CIM modules, wherein the second substrate is disposed vertically from the first substrate; and
   a second array of routers configured to route the information horizontally among the second array of compute units on the second substrate;
   wherein the first array of routers and the second array of routers send the information vertically between the first substrate and the second substrate.

2. The computing device of claim 1, wherein each of the first array of routers includes an in-plane portion having plurality of horizontal routing connections coupled with a portion of the first plurality of CIM modules and an out-of-plane portion.

3. The computing device of claim 2, wherein the out-of-plane portion includes at least one inductive coupling interface.

4. The computing device of claim 3, wherein the out-of-plane portion further includes a serializer/deserializer and a modulator/demodulator for sending and receiving the information.

5. The computing device of claim 3, wherein the out-of-plane portion is coupled between a compute unit of the first array of compute units and the in-plane portion.

6. The computing device of claim 3, wherein the plurality of horizontal routing connections includes not more than five horizontal routing connections.

7. The computing device of claim 1, wherein each router of the first array of routers and the second array of routers includes an in-plane portion having plurality of horizontal routing connections and an out-of-plane portion, the out-of-plane portion including at least one inductive coupling interface.

8. The computing device of claim 1, wherein a portion of the first array of routers includes an in-plane portion having plurality of horizontal routing connections coupled with a portion of the first plurality of CIM modules and an out-of-plane portion, the out-of-plane portion including at least one inductive coupling interface.

9. The computing device of claim 1, wherein a CIM module of the first plurality of CIM modules includes a plurality of storage cells storing data corresponding to a matrix and logic for performing a vector-matrix multiplication (VMM) of the matrix.

10. The computing device of claim 9, wherein the plurality of storage cells includes a plurality of SRAM cells.

11. The computing device of claim 1, wherein each of the first array of compute units includes a tile having a general purpose processor and a portion of the plurality of CIM modules.

12. The computing device of claim 1, further comprising:
    a third array of compute units arranged on a third substrate, wherein the third substrate is disposed vertically from the first substrate and from the second substrate; and
    a third array of routers configured to route the information horizontally among the third array of compute units on the third substrate;
    wherein the first array of routers, the second array of routers, and the third array of routers send information vertically between the first substrate, the second substrate, and the third substrate.

13. A computing system, comprising:
    a plurality of layers, each of the plurality of layers including a plurality of compute units and a plurality of routers arranged on a substrate, the plurality of compute units including a plurality of compute-in-memory (CIM) modules, the plurality of routers configured to route information horizontally among the plurality of compute units on the substrate, at least a portion of the plurality of routers being configured to wirelessly send the information vertically between the plurality of layers.

14. The computing system of claim 13, wherein the at least the portion of the plurality of routers are configured to inductively send the information vertically between the plurality of layers.

15. The computing system of claim 14, wherein each of the at least the portion of the plurality of routers includes at least one inductive coupling interface.

16. The computing system of claim 15, wherein each of the at least the portion of the plurality of routers includes an in-plane portion having plurality of horizontal routing connections coupled with a portion of the plurality of CIM modules.

17. A method comprising:
    transmitting information from a first compute unit of a first array of compute units to a first router of a first array of routers, the first array of compute units and the first array of routers being arranged on a first substrate, the first array of compute units including a first plurality of compute-in-memory (CIM) modules; and
    wirelessly sending the information from the first router to a second router of a second array of routers, the second array of routers and a second array of compute units being arranged on a second substrate, the second array of compute units including a second plurality of CIM modules, wherein the second substrate is disposed vertically from the first substrate,
    wherein the first array of routers horizontally between the first array of compute units and the second array of routers are configured to send data horizontally between the second array of compute units.

18. The method of claim 17, further comprising:
    sending the information from the second router to a second compute unit in the second array of compute units.

19. The method of claim 17, further comprising:
    serializing, by the first router, the information from the first compute unit to provide serialized information; and modulating, by the first router, the serialized information to provide modulated, serialized information;

wherein the wirelessly sending the information includes wirelessly sending the modulated, serialized information by the first router, the first router being inductively coupled with the second router.

20. The method of claim 19, further comprising demodulating, by the second router, the modulated, serialized information to provide the serialized information at the second router; and deserializing, by the second router, the serialized information.

* * * * *